(12) United States Patent
Sung

(10) Patent No.: US 7,696,834 B2
(45) Date of Patent: Apr. 13, 2010

(54) VOLTAGE CONTROLLED OSCILLATOR AND METHOD CAPABLE OF REDUCING PHASE NOISE AND JITTER WITH STARTUP GAIN

(75) Inventor: Ki-Hyuk Sung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/757,459

(22) Filed: Jun. 4, 2007

(65) Prior Publication Data

US 2008/0068097 A1    Mar. 20, 2008

(30) Foreign Application Priority Data

Jul. 4, 2006    (KR)    ........................ 10-2006-0062554

(51) Int. Cl.
*H03L 5/00*    (2006.01)
(52) U.S. Cl. .................... 331/109; 331/177 V; 331/183; 331/186
(58) Field of Classification Search .............. 331/36 C, 331/109, 117 R, 117 FE, 117 D, 116 R, 116 FE, 331/167, 173, 175, 182–183, 185–186, 177 V, 331/177 R See application file for complete search history.

(56) References Cited

U.S. PATENT DOCUMENTS

| 6,812,802 | B1 | 11/2004 | Godambe et al. |
| 6,825,736 | B1 * | 11/2004 | Kehler et al. ................. 331/183 |
| 6,909,336 | B1 | 6/2005 | Rajagopalan et al. |
| 7,026,883 | B2 * | 4/2006 | Muthali et al. ............... 331/183 |
| 7,061,337 | B2 * | 6/2006 | Partovi et al. ................ 331/109 |
| 7,123,113 | B1 * | 10/2006 | Brennan et al. ............. 331/158 |

FOREIGN PATENT DOCUMENTS

JP    2001-313527    11/2001

* cited by examiner

*Primary Examiner*—Vibol Tan
*Assistant Examiner*—Christopher Lo
(74) *Attorney, Agent, or Firm*—F. Chau & Associates, LLC

(57) ABSTRACT

A voltage-controlled oscillator includes: a bias voltage generator operating to generate first and second bias voltages in response to a control signal; a voltage-controlled oscillation circuit connected to a control node and configured to generate oscillation signals in response to an input voltage; a selection signal generator operating to generate a selection signal in response each to the oscillation signals; and a selection circuit operating to select one of the first and second bias voltages in response to the selection signal and outputting the selected bias voltage to the control node.

13 Claims, 4 Drawing Sheets

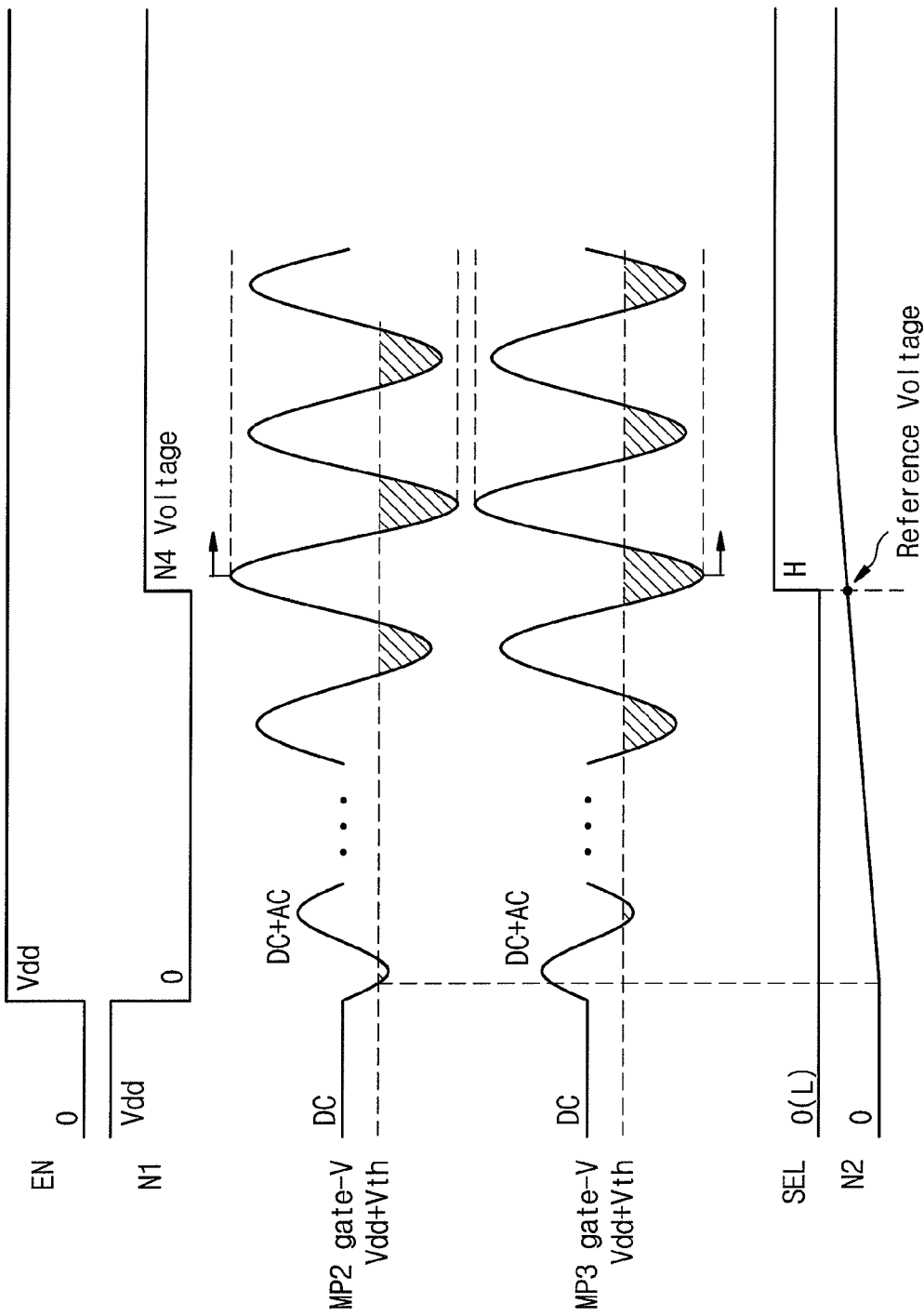

VOLTAGE CONTROLLED OSCILLATOR AND METHOD CAPABLE OF REDUCING PHASE NOISE AND JITTER WITH STARTUP GAIN

CROSS-REFERENCE TO RELATED APPLICATION

This U.S. non-provisional patent application claims priority under 35 U.S.C. 119 of Korean Patent Application No. 2006-62554 filed on Jul. 4, 2006, the entire contents of which are hereby incorporated by reference.

BACKGROUND

The present disclosure relates to phase-locked loops and, more particularly, to a voltage-controlled oscillator employed in a phase-locked loop.

Phase-locked loops (PLLs) are circuit modules for synchronizing internal clock signals with reference clock signals input from external devices and are used in many electronic circuits.

FIG. 1 is a block diagram of a typical phase-locked loop.

Referring to FIG. 1, a typical PLL is composed of a phase frequency detector (PFD) 101, a charge pump (CP) 102, a low-pass filter (LPF) 103, a voltage-controlled oscillator (VCO) 104, and feedback divider 105. The feedback divider 105 operates to divide an output clock (or oscillation) signal by a predetermined constant and transfer the divided clock signal back to the PFD 101. The PFD 101 compares a feedback clock signal FB_CLK from the feedback divider 105 with a reference clock signal RF_CLK input thereto, and generates up and down signals, UP and DOWN, which are different from each other in phase, on the basis of the compared result.

The CP 102 charges up an output node to raise an output voltage thereof in accordance with the up signal UP that is an output signal of the PFD 101, or discharges down the output node to drop the output voltage thereof. The LPF 103 removes a high-frequency component from the output voltage Vc of the CP 102. The VCO 104 receives the output voltage Vc from the CP 102 through the LPF 103. The VCO 104 generates two clock signals, VCO_out_p and VCO_out_n, which have frequencies corresponding to the input voltage Vc and are contrary to each other in phase by 180°, outputs the clock signals VCO_out_p and VCO_out_n to an external device, and supplies them as a feedback clock signal FB_CLK to the PFD 101 through the feedback divider 105.

FIG. 2 is a circuit diagram of a typical VCO 104 as shown in FIG. 1.

The most important building block is the VCO in the PLL circuit. For a stable operation of the VCO, it is required to set a startup gain at least larger than 1. The VCO 104 shown in FIG. 2 is provided to obtain a high startup gain.

Referring to FIG. 2, the VCO 104 includes a VCO circuit 201. The VCO circuit 201 is a circuit for functioning to permit the oscillation frequency to be controlled by a voltage. The VCO circuit 201 is composed of a PMOS transistor MP1, two inductors L1 and L2, two variable capacitors Cv1 and Cv2, and two transistors MN1 and MN2. The transistors denoted by MP and MN in FIG. 2 are kinds of metal-oxide-semiconductor field effect transistors (MOSFETs).

In the VCO 104, assuming that threshold voltages (Vth) of the transistors are in negative values, a sub-threshold voltage generator 202 is designed to make a voltage at its output node N3 to be slightly higher than Vdd+Vth, where Vth is a threshold voltage and Vdd is a power supply voltage. The sub-threshold voltage generator 202 operates to generate a DC voltage (sub-threshold voltage) to turn off PMOS transistors MP2 and MP3, and outputs the DC voltage to the gates of the transistors MP2 and MP3 respectively through resistors R1 and R2. Thus, the transistors MP2 and MP3 are turned off in response to a DC voltage supplied from the sub-threshold voltage generator 202.

When a control signal En has a low level, for example, 0V, a control signal En_b is set to a high level, for example, Vdd. The control signal En turns off transistor MN5, while the control signal En_b turns on transistor MN4. Because a node N2 is grounded by way of the transistor MN4, a transistor MN3 is turned off. The transistors MP2 and MP3 maintain their turn-off states due to the DC voltage provided from the sub-threshold voltage generator 202. A transistor MP4 is turned on in response to the control signal En having a low level, making a voltage at a node N1 turn to Vdd. Because the present voltage of the node N1 is Vdd, the transistor MP1 is turned off. Thus, there is no current through the transistor MP1 without activation of the VCO 104.

When the control signal En changes from low level, for example, 0V, to high level, for example, Vdd, the transistors MP4 and MN4 are turned off while a transistor MN5 is turned on. During this transition, the transistors MP2 and MP3 still maintain their turn-off states by the DC voltage supplied from the sub-threshold voltage generator 202. According to this condition, a voltage at the node N2 to turn on the transistor MN3 will be determined by a current source Is and a transistor MN6. Once the transistor MN3 is turned on, a voltage of the node N1 becomes 0V causing a large current to flow through the transistor MP1. Therefore, it is possible to increase a startup gain of the VCO 104. Being activated by the current flow through the transistor MP1, the VCO circuit 201 generates the two clock signals VCO_out_p and VCO_out_n, which have frequencies corresponding to the input voltage Vc and are contrary to each other in phase by 180°, by way of resonance with the inductor L1 and the variable capacitor Cv1, and resonance with the inductor L2 and the variable capacitor Cv2.

The two clock signals, VCO_out_p and VCO_out_n, generated from the VCO circuit 201 each contain DC components. Thus, the clock signals, VCO_out_p and VCO_out_n, have any DC components removed therefrom by action of the capacitors C1 and C2, respectively. Then, the clock signals, VCO_out_p and VCO_out_n, without DC components are connected to the gates of the transistors MP2 and MP3 and to the feedback divider 105 of FIG. 1. Voltages of the two clock signals VCO_out_p and VCO_out_n are combined with a DC voltage output from the sub-threshold voltage generator 202 and then the combined voltage is applied to gates of the transistors MP2 and MP3. The clock signals, VCO_out_p and VCO_out_n, applied to the gates of the transistors MN2 and MN3 fluctuate up and down on a voltage of the node N3, gradually increasing their amplitude. If the clock signals, VCO_out_p and VCO_out_n, generated from the VCO circuit 201 are increasing in amplitude, the transistors MN2 and MN3 that are turned off would be activated. For instance, the transistors MM2 and MM3 may be turned on when a voltage variation range of the clock signals VCO_out_p and VCO_out_n is lower than Vdd+Vth.

If the transistors MN2 and MN3 are turned on, the voltage of the node N1 gradually increases from its initial voltage 0V, decreasing a current flowing through the transistor MP1. Owing to the reduction of the current flowing through the transistor MP1, the clock signals, VCO_out_p and VCO_out_n, are also reduced in amplitude. As a result, since the VCO 104 forms a negative feedback loop, the amplitude of the clock signals, VCO_out_p and VCO_out_n, is inclined to converge on an adequate value, and will not enlarge indefinitely.

A voltage of the node N1, that adjusts the amount of the current flowing through the transistor MP1, is determined by the currents flowing through the transistors MN3, MP2, and MP3. A gate voltage of the transistor MN3 maintains a constant level, while the gate voltages of the transistors MP2 and MP3 normally fluctuate by the two clock signals VCO_out_p and VCO_put_n output from the VCO circuit 201. Thereby, there would be generated phase noise and jitter. As a result, although the VCO 104 has a high startup gain by a large bias current at an activation time thereof, it effects a large amount of jitter or phase noise.

SUMMARY OF THE INVENTION

Exemplary embodiments of the present invention are directed to provide a voltage-controlled oscillator and method capable of reducing phase noise or jitter, even while retaining a high startup gain.

An exemplary embodiment of the present invention is a voltage-controlled oscillator including: a bias voltage generator operating to generate first and second bias voltages in response to a control signal; a voltage-controlled oscillation circuit connected to a control node and configured to generate oscillation signals in response to an input voltage; a selection signal generator operating to generate a selection signal in response to each of the oscillation signals; and a selection circuit operating to select one of the first and second bias voltages in response to the selection signal and outputting the selected bias voltage to the control node.

In an exemplary embodiment, the bias voltage generator includes: a first voltage generator outputting a ground voltage as the first bias voltage; and a second voltage generator outputting the second bias voltage in response to the control signal.

In an exemplary embodiment, the selection signal generator includes: a sub-threshold voltage generator configured to supply a sub-threshold voltage through resistors to signal lines for transferring the oscillation signals; and a detector operating to detect whether each voltage of the signal lines reaches a detection voltage and generating the selection signal in accordance with a result of the detection.

In an exemplary embodiment, the voltage-controlled oscillator further includes a disabling circuit operating to disable the bias voltage generator in response to the control signal.

In an exemplary embodiment, the disabling circuit is connected between the control node and a power supply voltage terminal, including a PMOS transistor controlled by the control signal.

In an exemplary embodiment, the voltage-controlled oscillation circuit is inactivated when a power supply voltage is supplied to the control node through the disabling circuit.

According to an exemplary embodiment, the selection circuit operates to select the first bias voltage in response to the selection signal if each voltage of the oscillation signals is less than a detection voltage, while to select the second bias voltage in response to the selection signal if each voltage of the oscillation signals reaches the detection voltage.

In an exemplary embodiment, the voltage-controlled oscillator further includes a switch connected between the control node and the selection circuit and operated in response to the control signal.

According to an exemplary embodiment, the voltage-controlled oscillator further includes capacitors removing DC components from the oscillation signals and transferring the DC-removed oscillation signals to the selection signal generators.

In an exemplary embodiment, the oscillation signals are contrary to each other in phase by 180°.

Another exemplary embodiment of the present invention provides a phase-locked loop including: a phase comparator operating to compare a feedback clock signal with a reference clock signal; a charge pump generating a control voltage in response to an output of the phase comparator; a voltage-controlled oscillator generating oscillation signals in response to the control voltage; and a feedback divider operating to divide the oscillation signals into clock signals and outputting the divided clock signals as a feedback clock signal.

Still another exemplary of the present invention provides a method for operating a voltage-controlled oscillator. The method is comprised of: generating a selection signal in accordance with whether an output of the voltage-controlled oscillator reaches a detection voltage; selecting one of first and second bias voltages in response to the selection signal; and generating oscillation signals as an output of the voltage-controlled oscillator in response to the selected bias voltage.

In an exemplary embodiment, the first bias voltage is selected when the output of the voltage-controlled oscillator is less than the detection voltage, and the second bias voltage is selected when the output of the voltage-controlled oscillator reaches the detection voltage.

In an exemplary embodiment, the first bias voltage is a ground voltage and the second bias voltage is intermediate between the ground voltage and a power supply voltage.

A further understanding of the nature and advantages of the exemplary embodiments of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the accompanying figures, wherein like reference numerals refer to like parts throughout the various figures unless otherwise specified. In the figures:

FIG. 4 is a timing diagram of signals operating in the voltage-controlled oscillator shown in FIG. 3.

DETAILED DESCRIPTION OF EXEMPLARY EMBODIMENTS

Figure 1:
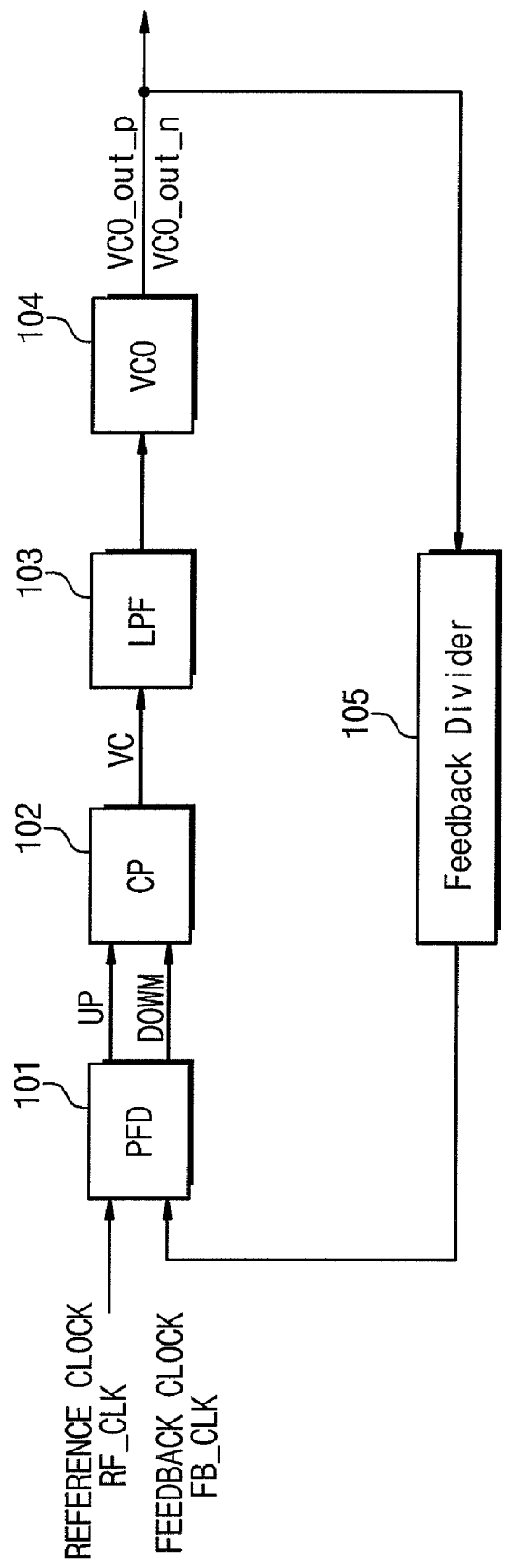
FIG. 1 is a block diagram of a typical known phase-locked loop.
Figure 2:
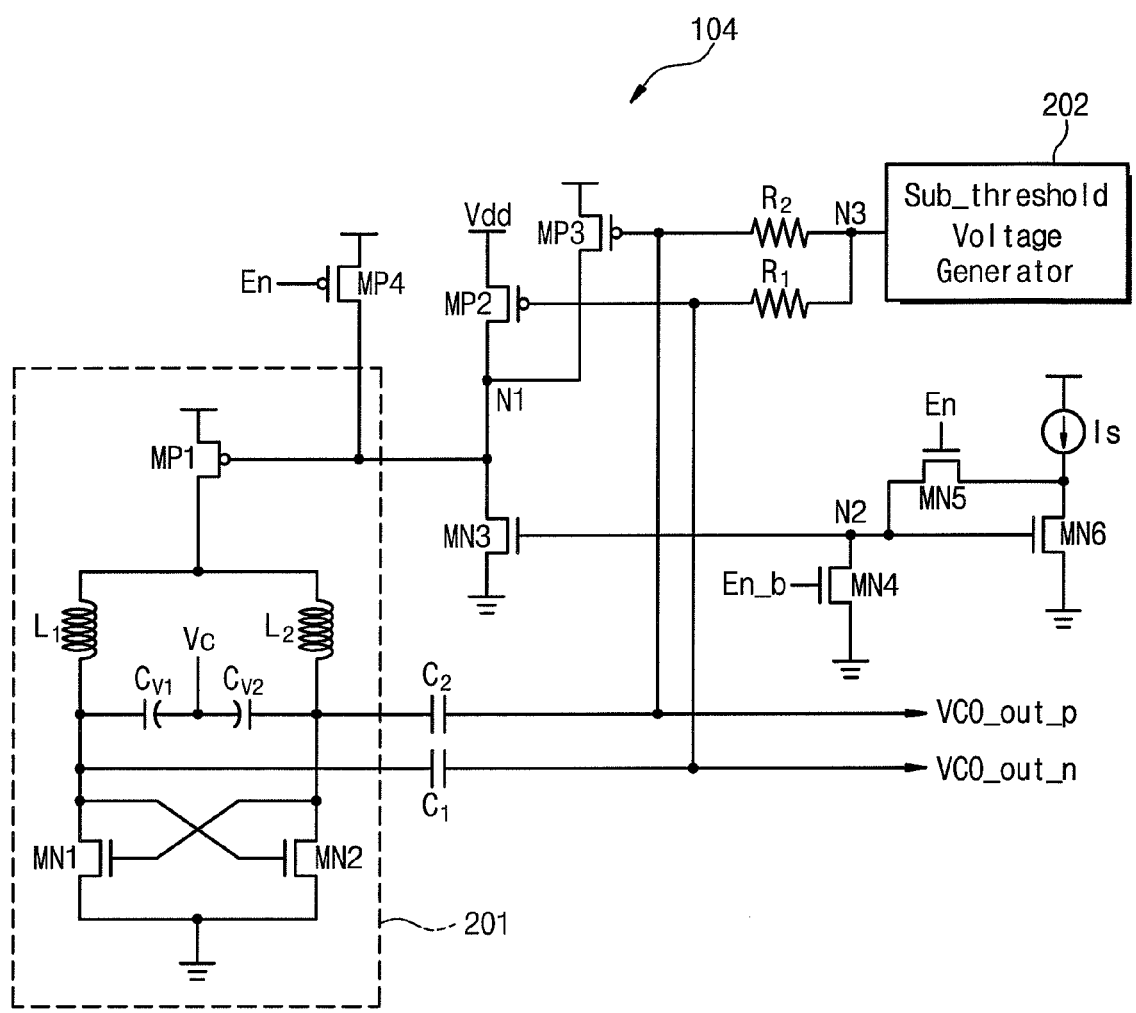
FIG. 2 is a circuit diagram of the voltage-controlled oscillator in the circuit shown in FIG. 1.

Exemplary embodiments of the present invention will be described below in more detail with reference to the accompanying drawings. The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those of ordinary skill in the art. Like reference numerals refer to like elements throughout the accompanying figures.

According to an exemplary embodiment of the present invention, a VCO is comprised of: a bias voltage generator operating to generate first and second bias voltages; a VCO circuit connected to a control node and generating oscillation signals in response to an input voltage; a selection signal generator operating to generate a selection signal in response to voltages of the oscillation signals; and a selection circuit operating to select one of the first and second bias voltages, in response to the selection signal, and outputting the selected bias voltage to the control node. During an operation of the VCO, the first or second bias voltage is supplied to the VCO circuit from the bias voltage generator in response to the selection signal provided from the selection signal generator. The VCO circuit has a very large current flowing therethrough in correspondence with an input of the first bias voltage and operates with an optimum current in correspondence with an input of the second bias voltage. Thus, the VCO according to an exemplary embodiment of the present invention maintains a high startup gain at an initial time, and thereafter operates by tire bias voltage with a predetermined level, reducing phase noise and jitter.

Figure 3:
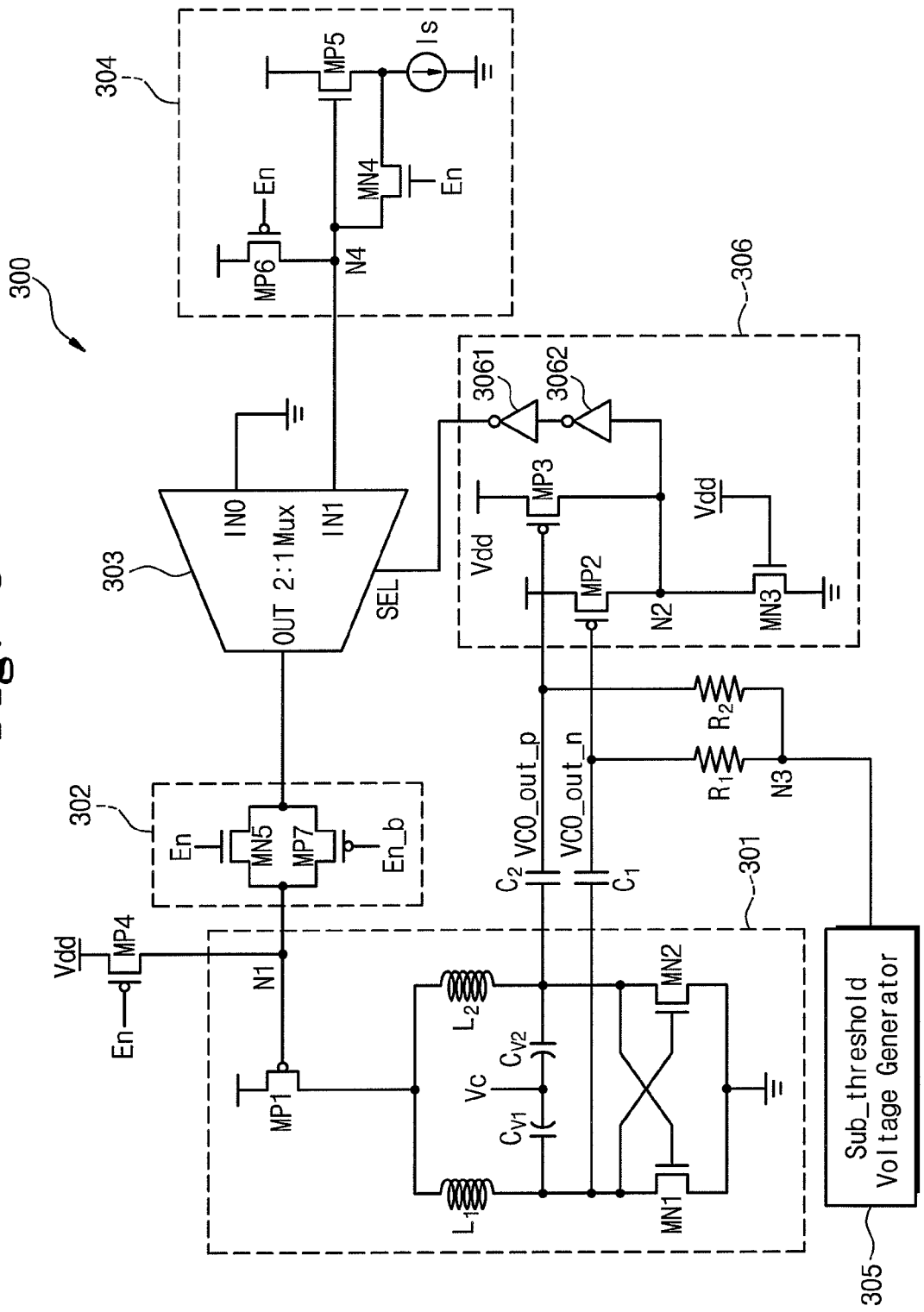
FIG. 3 is a circuit diagram of a voltage-controlled oscillator according to an exemplary embodiment of the present invention.

FIG. 3 is a circuit diagram of a VCO according to an exemplary embodiment of the present invention.

Referring to FIG. 3, the VCO 300 according to this exemplary embodiment of the present invention is comprised of a PMOS transistor MP4, a VCO circuit 301, a transmission gate 302, a 2:1 multiplexer (Mux) 303, a bias voltage generator 304, a sub-threshold voltage generator 305, and a detector 306. The PMOS transistor MP4 controls activation of the VCO circuit 301 by connecting it to the power supply Vdd, and also functioning as a disabling circuit for the VCO circuit 301. The VCO circuit 301 generates two oscillation signals (hereinafter, 'clock signals'), which have a frequency corresponding to an input voltage and are different in phase by 180°. The transmission gate 302 functions as a switch responding to control signals En and En_b. The 2:1 multiplexer 303 operates to supply either a first bias voltage (hereinafter, 'ground voltage') or a second bias voltage (hereinafter, 'fixed bias voltage') of the bias voltage generator 304 to the VCO circuit 301 in response to an output signal of the detector 306. The bias voltage generator 304 functions to generate the fixed bias voltage. The sub-threshold voltage generator 305 provides a DC voltage, that is, sub-threshold voltage, to torn off transistors MP2 and MP3 of the detector 306. The detector 306 adds the DC voltage of the sub-threshold voltage generator 305 to each of the two clock signals VCO_out_p and VCO_out_n of the VCO circuit 301, detects whether the clock signals reach a detection voltage, and then outputs a detection signal to the multiplexer 303 as a result thereof. Transistors denoted by MP and MN in FIG. 3 are kinds of MOSFETs.

In the transistor MP4 controlling activation of the VCO circuit 301, a gate is coupled to the control signal En and a source is connected to a power supply voltage terminal Vdd. A drain of the transistor MP4 is connected to a node N1 of the VCO circuit 301. The transistor MP4 is turned on when the control signal En is at a low level, for example, 0V, and is turned off when the control signal En is at a high level for example, Vdd. If the transistor MP4 is turned on, the VCO circuit 301 becomes active. If the transistor MP4 is turned off, the VCO circuit 301 becomes inactive.

The transmission gate 302 includes transistors MN5 and MN7. A gate of the transistor MN5 is coupled to the control signal En while a gate of the transistor MN7 is coupled to the control signal En_b. A source of the transistor MN5 and a drain of the transistor MN7 are connected in common to the node N1. A drain of the transistor MN5 and a source of the transistor MN7 are connected in common to an output terminal OUT of the 2:1 multiplexer 303. If the transistors MN5 and MN7 of the transmission gate 302 are turned off by the control signals En=0V and En_b=Vdd, the transmission gate 302 turns to an open state. Thus, the control node N1 is electrically disconnected from the output terminal OUT of the 2:1 multiplexer 303. Otherwise, the control node N1 is electrically connected to the output terminal OUT of the 2:1 multiplexer 303 when the transistors MN5 and MN7 of tire transmission gate 302 are turned on by the control signals En=Vdd and En_b=0V.

The VCO circuit 301 is comprised of a PMOS transistor MP1, a pair of inductors L1 and L2, a pair of variable capacitors Cv1 and Cv2, and a pair of NMOS transistors MM1 and MN2. In the transistor MN1, a gate is coupled to the control node N1, a source is connected to the power supply terminal Vdd, and a drain is connected to a common node of the inductors L1 and L2 of the VCO circuit 301. The transistor MP1 supplies a current to the inductors L1 and L2 for operating the VCO circuit 301 in response to a voltage of the control node N1. As described above, a common node of the inductors L1 and L2 is connected to the drain of the transistor MP1. The other end of the inductor L1 is connected to an end of the variable capacitor Cv1 and a gate of the transistor MN2 in common, as well as being connected to a gate of the transistor MP2 of the detector 306 through a capacitor C1. The other end of the inductor L2 is connected to an end of the variable capacitor Cv2 and a gate of the transistor MN1 in common, as well as being connected to a gate of the transistor MP3 of the detector 306 through a capacitor C2. Sources of the transistors MM1 and MM2 are connected to the ground voltage. If the VCO circuit 301 is activated by current flowing through the transistor MP1 of the VCO circuit 301, the VCO circuit 301 generates the two clock signals VCO_out_p and VCO_out_n, which have a frequency corresponding to an input voltage Vc and are opposite to each other in phase by 180°, from resonance with the inductor L1 and the variable capacitor Cv1 and resonance with the inductor L2 and the variable capacitor Cv2.

The sub-threshold voltage generator 305 is connected to the gate of the transistor MP2 through a first resistor R1, and connected to the gate of the transistor MP3 through a second resistor R2. The sub-threshold voltage generator 305 operates to generate a DC voltage, that is, sub-threshold voltage, to turn off the transistors MP2 and MP3 of the detector 306.

The detector 306 is constructed with the transistors MP2 and MP3, an NMOS transistor MN3, and inverters 3061 and 3062. Sources of the transistors MP2 and MP3 are connected to the power supply terminal Vdd, and drains thereof are connected to a node N2. The node N2 is connected to a drain of the transistor MN3 and connected to a selection node SEL of the 2:1 multiplexer 303 through the inverters 3061 and 3062. A gate of the transistor MN3 is coupled to the power supply terminal Vdd and a source thereof is connected to the ground voltage. The transistor MN3 is designed in a small size to increase a voltage of the node N2 caused by the turn-on states of the transistors MP2 and MP3. The detector 306 accepts a signal formed by adding the DC voltage of the sub-threshold voltage generator 305 to the voltage of each of the two clock signals output from the VCO circuit 301, through the gates of the transistors MP2 and MP3, and then detects whether the accepted signal reach the detection voltage. The detector 306 generates the selection signal to the control terminal SEE of the 2:1 multiplexer 303 in accordance with a result of the detection.

An input terminal IN0 of the 2:1 multiplexer 303 is connected to the ground voltage, while the other terminal IN1 thereof is connected to a drain of a transistor MP6, a source of a transistor MN4, and a gate of a transistor MP5. The output terminal OUT of the 2:1 multiplexer 303 is connected to the transmission gate 302. If a low level signal is applied to the selection terminal SEL of the 2:1 multiplexer 303, the input terminal IN0 is coupled to the output terminal OUT. Thus, the VCO circuit 301 is supplied with the ground voltage. If a high (H) level signal is applied to the selection terminal SEL of the 2:1 multiplexer 303, the input terminal IN1 is coupled to the output terminal OUT. Thus, the VCO circuit 301 is supplied with a constant bias voltage provided from the bias voltage generator 304.

The bias voltage generator 304 is composed of the transistors MN4, MP5, and MP6, and a current source Is. A source of the transistor MP6 is connected to the power supply terminal Vdd, a gate thereof is coupled to the control signal En, and a drain thereof is connected to the source of the transistor MN4, the gate of the transistor MP5, and the input terminal IN1 of the 2:1 multiplexer 303 through a node N4. A source of the transistor MP5 is connected to the power supply terminal Vdd, and a drain thereof is connected to the ground voltage through the current source Is along with a drain of the transistor MN4. A gate of the transistor MN4 receives the control signal En. The bias voltage generator 304 outputs a constant bias voltage, when the control signal En is at a high level, for example, Vdd, to the VCO circuit 301 through the transmission gate 302 connected to the output terminal OUT of the 2:1 multiplexer 303.

With this structure of an exemplary embodiment of the present invention, tire VCO is able to obtain a very large startup gain by operating with a large amount of current at an initial time and afterward to regulate the amplitude of the clock signals by adjusting an amount of current by means of a constant bias voltage. Further, the constant bias voltage contributes to reducing phase noise and jitter.

In an exemplary embodiment the bias voltage generator 304 could be connected to the input terminal IN0 of the 2:1 multiplexer 303, that was associated with a ground voltage, in the exemplary embodiment of FIG. 3, for generating a low level voltage, that is, the ground voltage.

In this exemplary embodiment, the 2:1 multiplexer 303 functions as a selection circuit.

In an exemplary embodiment, the VCO circuit 301 may be include the control node N1, or be connected to the control node N1 located outside of the VCO 301.

In an exemplary embodiment, the sub-threshold voltage generator 305, the resistors R1 and R2, and the detector 306 may be included in a circuit block for generating the selection signal. For instance, a selection signal generator may include the sub-threshold voltage generator 305, the resistors R1 and R2, and the detector 306.

FIG. 4 is a timing diagram of signals operating in the VCO 300 shown in FIG. 3.

Now, an operation of the VCO 300 will be described as follows in conjunction with FIGS. 3 and 4.

Assuming that in the VCO 300 of the exemplary embodiment of the present invention, the transistors MP2 and MP3 have negative threshold voltages (Vth), the sub-threshold voltage generator 305 is designed to generate an output voltage, at a node N3, slightly higher than Vdd+Vth. The sub-threshold voltage generator 305 outputs the DC voltage, that is, sub-threshold voltage, to turn off the transistors MP2 and MP3 of the detector 306. The DC voltage is applied to the gate of the transistor MP2 through the resistor R1 and to the gate of the transistor MP3 through the resistor R2. Thus, the transistors, MP2 and MP3, of the detector 306 are turned off by the DC voltage provided from the sub-threshold voltage generator 305.

When the control signal En is at a low level, for example, 0V, the control signal En_b is at a high level, for example, Vdd. During this time, as the control signals En and En_b turn off the transistors MN5 and MP7 of the transmission gate 302, the node N1 and the output terminal OUT of the 2:1 multiplexer 303 are electrically disconnected in an open state of the transmission gate 302. The transistors MP2 and MP3 of the detector 306 are being turned off by the DC voltage supplied from tire sub-threshold voltage generator 202. But as the transistor MN3 is turned on by the power supply voltage Vdd coupled to its gate, a voltage of the node N2 becomes 0V. If the voltage of the node N2 of the detector 306 becomes 0V, the selection terminal SEL of the 2:1 multiplexer 303 is supplied with a low (L) level signal (see FIG. 4) through the inverters 3061 and 3062 and thereby the low level voltage, that is, the ground voltage, connected to the input terminal IN0 is selected as an output thereof. On the other hand, because the transmission gate 302 is in an open state, an output of the 2:1 multiplexer 303 does not affect the node N1. The transistor MN4 is turned on in response to the control signal En of a low level. A voltage of the node N1 goes to Vdd because the transistor MP4 is turned on and is supplied with the power supply voltage Vdd through its source. As the voltage of the node N1 is Vdd, the transistor MP1 is turned off to shut off current flow therethrough. Thus, the VCO circuit 301 is inactivated because there is no current flow through the transistor MP1.

When the control signal En changes from the low level, for example, 0V, to the high level, for example, Vdd, the transistor MP4 is turned off. During this time, the transistors MN5 and MN7 of the transmission gate 302 are turned on by the control signals En and En_b the node N2 is electrically connected to the selection terminal SEL of the 2:1 multiplexer 303. The transistors MP2 and MP3 of the detector 306 still maintain their turn-off states by the DC voltage supplied from the sub-threshold voltage generator 305. But, the transistor MN3 of the detector 306 is turned on in response to the power supply voltage Vdd coupled to its gate, and a voltage of the node N2 becomes 0V. If the voltage of the node N2 is 0V, the selection terminal SEL of the 2:1 multiplexer 303 is supplied with a low level signal through the inverters 3061 and 3062 and a low level voltage, that is, the ground voltage, connected to the input terminal IN0 is selected as an output thereof. Thus, a voltage of the node N1 goes to 0V. If the voltage of the node N1 becomes 0V, the transistor MP1 is turned on thereby causing a very large current to flow therethrough. Thereby, it is possible to sufficiently enlarge a startup gain.

If the VCO circuit 301 is activated by current flowing through the transistor MP1 of the VCO circuit 301, the VCO circuit 301 generates the two clock signals VCO_out_p and VCO_out_n, which have a frequency corresponding to the input voltage Vc and are opposite to each other in phase by 180°, from resonance with the inductor L1 and the variable capacitor Cv1 and resonance with the inductor L2 and the variable capacitor Cv2. While the two clock signals VCO_out_p and VCO_out_n are generated from the VCO circuit 301, small resistive components are also induced (not shown in FIG. 3). These small resistive components are removed by the transistors MN1 and MN2 of the VCO circuit 301. The transistors MN1 and MN2 act as negative resistors that are the same as the resistive components, which are induced while generating the two clock signals VCO_out_p and VCO_out_n, in resistance, but having negative values.

The two clock signals, VCO_out_p and VCO_out_n, generated from the VCO circuit 301 include DC components. The DC components are removed from the clock signals VCO_out_p and VCO_out_n by way of the capacitors C2 and C1, respectively. Then, the clocks signal VCO_out_p and VCO_out_n without the DC components are applied to the gates of the transistors MP2 and MP3 and are fed back the PFD shown at 101 in FIG, 1.

After adding the clock signals VCO_out_p and VCO_out_n of the VCO circuit 301 and the DC voltage of the sub-threshold voltage, the added voltages are applied to the gates of the transistors MP2 and MP3 of the detector 306. Thus, the two clock signals VCO_out_p and VCO_out_n applied to tire gates of the transistors MP2 and MP3 fluctuate up and down on a voltage of the node N3, increasing in amplitude. In FIG. 4, MP2 gate-V and MP3 gate-V represent signal waveforms respectively applied to each gate of the transistors MP2 and MP3.

The detector 306 accepts signals, which result from adding the two clock signals VCO_out_p and VCO_out_n of the VCO circuit 301 to the voltage of the node N3 after being dropped by resistors R1 and R2, at the gates of the transistors MP2 and MP3. If the signals reach predetermined voltage levels, the transistors MP2 and MP3 are turned on. Since a threshold voltage of the PMOS transistor has a negative value Vth, voltages turning on the transistors MP2 and MP3 are less than Vdd+Vth. Therefore, the transistors MP2 and MP3 are turned on when voltages of the clock signals VCO_out_p and VCO_out_n are lower than Vdd+Vth. As illustrated in FIG. 4, the transistors MP2 and MP3 are turned on in the shaded regions of MP2 gate-V and MP3 gate-V. As the two clock signals VCO_out_p and VCO_out_n generated by the VCO circuit 301 are gradually increased in amplitude, a voltage of the node N2 of the detector 306 rises more and more from its initial value of 0V if the transistors MP2 and MP3 are turned on. In this exemplary embodiment, the NMOS transistor MN3 is designed smaller to increase the voltage of the node N2 by the conduction of the transistors MP2 and MP3 when the transistors MP2 and MP3 are tamed on. If the clock signals VCO_out_p and VCO_out_n of the VCO circuit 301 are gradually increased in amplitude, as is the detection voltage, the voltage of the node N2 rises over a reference voltage level. The voltage of the node N2 then rises to a constant level and is maintained there.

The detector 306 outputs a high (H) level signal to the selection terminal SEL of the 2:1 multiplexer 303 by way of the inverters 3061 and 3062 when the voltage of the node N2 rises over the reference voltage level. Otherwise, unless the voltage of the node N2 rises over the reference voltage level, the detector 305 outputs a low (L) level signal to the selection terminal SEL of the 2:1 multiplexer 303 by way of the inverters 3061 and 3062. The reference voltage level is variable by specifically selecting the inverters 3061 and 3062, and in an exemplary embodiment is Vdd/2.

Therefore, if the voltage of the node N2 increases to be over the reference voltage level, the high level signal (H) is applied to the selection terminal SEL of the 2:1 multiplexer 303 through the inverters 3061 and 3062. During this time, the output terminal OUT of the 2:1 multiplexer 303 is electrically connected to the bias voltage generator 304 in response to the selection signal of the high level (H). Thereby, the node N1 is supplied with the fixed bias voltage from the output terminal OUT of the 2:1 multiplexer 303 through the transmission gate 302. During this VCO operation, the selection terminal SEL of the 2:1 multiplexer 303 maintains the high level (H).

In the bias voltage generator 304, when the control signal En changes from low level, for example, 0V, to high level, for example, Vdd, the transistor MP6 is turned off while the transistors MN4 and MP5 are turned on. Therefore, a voltage generated by the bias voltage generator 304, that is, a voltage of the node N4, is determined by an amount of current through the current source Is and a size of the transistor MP5. The bias voltage from the bias voltage generator 304 is lower than Vdd and maintained at a constant level, that is, there is a fixed bias voltage.

If the high level signal (H) is applied to the selection terminal SEL of the 2:1 multiplexer 303 and the output terminal OUT of the 2:1 multiplexer 303 is electrically connected to the bias voltage generator 304 in response to the high level signal, the voltage of the node N4 is equal to a voltage of the node N1 of the VCO circuit 301. In this steady state, the voltage of the node N1 of the VCO circuit 301, adjusting an amount of current flowing through the transistor MP1, is determined an amount of current flowing in tire current source Is and a size of the transistor MP5 in the bias voltage generator 304. Thus, a current flowing through the transistor MP1 is adjusted by the bias voltage provided by the bias voltage generator 304. Owing to this adjustment of current through the transistor MP1 by the bias voltage from the bias voltage generator 304, the two clock signals VCO_out_p and VCO_out_n output from the VCO circuit 301 become smaller in amplitude. Namely, a current flowing through the transistor MP1 of the VCO circuit 301 optimizes the amplitude of the clock signals VCO_out_p and VCO_out_n, which are output from the VCO circuit 301, to an adequate value. Additionally, because of the constant current provided by the current source Is and a size of the transistor MP5 in the bias voltage generator 304, the phase noise and jitter are reduced in the output of the VCO 300 shown in FIG. 3.

As a result, according to an exemplary embodiment of the present invention, the VCO is able to obtain a very large startup gain by operating with a large amount of current at an initial time and afterward regulate the amplitude of the clock signals by adjusting an amount of current by means of a constant bias voltage. Further, the constant bias voltage contributes to reducing phase noise and jitter.

The above-disclosed subject matter is to be considered illustrative, and not restrictive, and the appended claims are intended to cover all such modifications, enhancements, and other exemplary embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A voltage-controlled oscillator comprising:
   a bias voltage generator operating to generate a first bias voltage in response to a control signal;
   a voltage-controlled oscillation circuit connected to a control node and configured to generate oscillation signals in response to an input voltage;
   a selection signal generator operating to generate a selection signal in response to each of the oscillation signals; and
   a selection circuit operating to select one of the first bias voltage and a second bias voltage in response to the selection signal and outputting the selected bias voltage to the control node;
   wherein the selection signal generator comprises:
   a sub-threshold voltage generator configured to supply a sub-threshold voltage through respective resistors to each signal line transferring the oscillation signals; and a detector operating to detect whether each voltage of the signal lines reaches a detection voltage and generating the selection signal in accordance with a result of the detection.

2. The voltage-controlled oscillator as set forth in claim 1, wherein the second bias voltage is a ground voltage and the bias voltage generator comprises:
a voltage generator outputting the first bias voltage in response to the control signal.

3. A voltage-controlled oscillator comprising:
a bias voltage generator operating to generate a first bias voltage in response to a control signal;
a voltage-controlled oscillation circuit connected to a control node and configured to generate oscillation signals in response to an input voltage;
a selection signal generator operating to generate a selection signal in response to each of the oscillation signals; and
a selection circuit operating to select one of the first bias voltage and a second bias voltage in response to the selection signal and outputting the selected bias voltage to the control node; and
a disabling circuit operating to disable the bias voltage generator in response to the control signal.

4. The voltage-controlled oscillator as set forth in claim 3, wherein the disabling circuit is connected between a control node of the bias voltage generator and a power supply voltage terminal and includes a PMOS transistor controlled by the control signal.

5. The voltage-controlled oscillator as set forth in claim 3, wherein the voltage-controlled oscillation circuit is inactivated when a power supply voltage is supplied to a control node of the bias voltage generator through the disabling circuit.

6. The voltage-controlled oscillator as set forth in claim 2, wherein the selection circuit operates to select the second bias voltage in response to the selection signal when each voltage of the oscillation signals is less than a detection voltage, and to select the first bias voltage in response to the selection signal when each voltage of the oscillation signals reaches the detection voltage.

7. The voltage-controlled oscillator as set forth in claim 1, further comprising: a switch to disconnect the control node from the selection circuit in response to the control signal.

8. The voltage-controlled oscillator as set forth in claim 1, further comprising: capacitors removing DC components from the oscillation signals and transferring the DC-removed oscillation signals to the selection signal generator.

9. The voltage-controlled oscillator as set forth in claim 1, wherein the oscillation signals are opposite to each other in phase by 180°.

10. A method for operating a voltage-controlled oscillator, wherein the method comprises:
generating a selection signal in accordance with whether an output of the voltage-controlled oscillator reaches a detection voltage;
selecting one of first and second bias voltages in response to the selection signal; and
generating oscillation signals as an output of the voltage-controlled oscillator in response to the selected bias voltage,
wherein the second bias voltage is selected when the output of the voltage-controlled oscillator is less than the detection voltage, and the first bias voltage is selected when the output of the voltage-controlled oscillator reaches the detection voltage.

11. The method as set forth in claim 10, wherein the second bias voltage is a ground voltage and the first bias voltage is intermediate between the ground voltage and a power supply voltage.

12. The voltage-controlled oscillator as set forth in claim 1, wherein the first and second bias voltages are independent of the oscillation signals.

13. The method of claim 10, wherein the first and second bias voltages are independent of the oscillation signals.

* * * * *